United States Patent

Shen et al.

[11] Patent Number: 5,867,433
[45] Date of Patent: Feb. 2, 1999

[54] SEMICONDUCTOR MEMORY WITH A NOVEL COLUMN DECODER FOR SELECTING A REDUNDANT ARRAY

[75] Inventors: Chiun-Chi Shen; Yen-Tai Lin, both of Hsinchu; Jiang-Hong Ho, Kaoshung City; Jack-Lian Kuo, Tainan; Howard Clayton Kirsch, Taoyuan, all of Taiwan

[73] Assignee: Vanguard International Semiconductor Corporation, Hsin-Chu, Taiwan

[21] Appl. No.: 893,642

[22] Filed: Jul. 11, 1997

[51] Int. Cl.⁶ ........................................ G11C 7/00
[52] U.S. Cl. .................. 365/200; 365/225.7; 365/230.06
[58] Field of Search .............................. 365/200, 230.06, 365/225.7

[56] References Cited

U.S. PATENT DOCUMENTS

| | | | |
|---|---|---|---|
| 5,257,229 | 10/1993 | McClure et al. | 365/200 |
| 5,471,426 | 11/1995 | McClure | 365/200 |
| 5,570,318 | 10/1996 | Ogawa | 365/200 |
| 5,596,535 | 6/1997 | Mushya et al. | 365/230.06 |
| 5,642,316 | 6/1997 | Tran et al. | 365/230.06 |
| 5,657,280 | 8/1997 | Shin et al. | 365/230.06 |
| 5,689,463 | 11/1997 | Murakami et al. | 365/230.06 |

*Primary Examiner*—Son T. Dinh
*Attorney, Agent, or Firm*—George O. Saile; Stephen B. Ackerman

[57] ABSTRACT

Circuits and a method are described that integrate memory arrays, a redundant memory array, their associated decoders, sense amplifiers, and outputs into one module. This integration is achieved through the use of a column decoder with a fuse, which, when blown, permanently deselects the failing array and selects the redundant array. By OR'ing the redundant column select line of each column decoder, any column decoder can select the redundant array. Higher level array structures are produced by replication of the lower level array structure. The system output is generated by OR'ing together the respective data outputs of each array.

22 Claims, 7 Drawing Sheets

FIG. 5 – Prior Art

SEMICONDUCTOR MEMORY WITH A NOVEL COLUMN DECODER FOR SELECTING A REDUNDANT ARRAY

BACKGROUND OF THE INVENTION

1. Field of the Invention

The invention relates to the field of integrated circuits and, more particularly, to a novel column decoder as applied to redundant memory arrays.

2. Description of the Prior Art

As semiconductor memories become ever larger, be they static random access memories (SRAM) or dynamic random access memories (DRAM), the size and complexity of the associated redundant memory arrays is growing equally. Not surprisingly, redundant memory arrays have received intense design scrutiny in the areas of replacement schemes for defective array columns or rows, and the design of column decoders or multiplexers.

An example of the prior art design is shown in FIG. 5, where arrays 500 are adjoined by redundant array 505, column decoders 510 are adjoined by redundant column decoders 515, and sense amplifier arrays 520 are adjoined by redundant sense amplifiers 525. Sense amplifier array output (SIO) 501 and redundant sense amplifier array output (XIO) 502 feed into IO multiplexers 530, which provides the final output (IO) 503.

An example of a semiconductor memory incorporating redundant arrays is disclosed in U.S. Pat. No. 5,257,229 (McClure et al.). This patent provides column redundancy by mapping a redundant column into multiple block addresses. U.S. Pat. No. 5,471,426 (McClure) includes redundant columns which may replace a column in any of the memory blocks selected by redundant column decoders. This design requires additional column decoders and complicated multiplexers. U.S. Pat. No. 5,570,318 (Ogawa) discloses a semiconductor memory having two redundant columns per block, with each block having one dedicated redundancy column decoder.

SUMMARY OF THE INVENTION

It is an object of the present invention to provide circuits and a method that allow a column decoder to select a redundant array if its own array is found defective without requiring extra column decoders.

Another object of the present invention is to have neighboring cells in an array arranged to be of the same column address.

A further object of the present invention is to provide circuits and a method that reduce wiring, eliminate the need for extra column decoders, addressing for redundant arrays, redundant Input/Output (XIO) signals, and complex IO multiplexing circuits.

These objects have been achieved by providing above mentioned components in one basic module, including a novel column decoder with a fuse, which, when blown, permanently deselects the failing array and selects the redundant array. By OR'ing the redundant column select line of each column decoder, any column decoder can select the redundant array. Simplicity of output wiring has been maintained by OR'ing together respective data outputs of each basic module. Next higher level array structures are produced by replication of the present level array structure.

DESCRIPTION OF THE PREFERRED EMBODIMENT

The design of redundant memory arrays has led to ever more complex schemes in an attempt to protect from a "killing defect". A natural byproduct has been increased circuit complexity, increased circuit real estate demands, and increased timing delays. This present invention proposes a novel approach by having the column decoder array select the redundant array as part of the regular array. This has been achieved through a new column decoder which DOT-OR'es all its redundant array column select lines. In addition, this invention allows simple DOT-OR'ing of sense amplifier outputs (be they redundant or regular), and of the outputs of the next higher level structure.

Figure 1A:
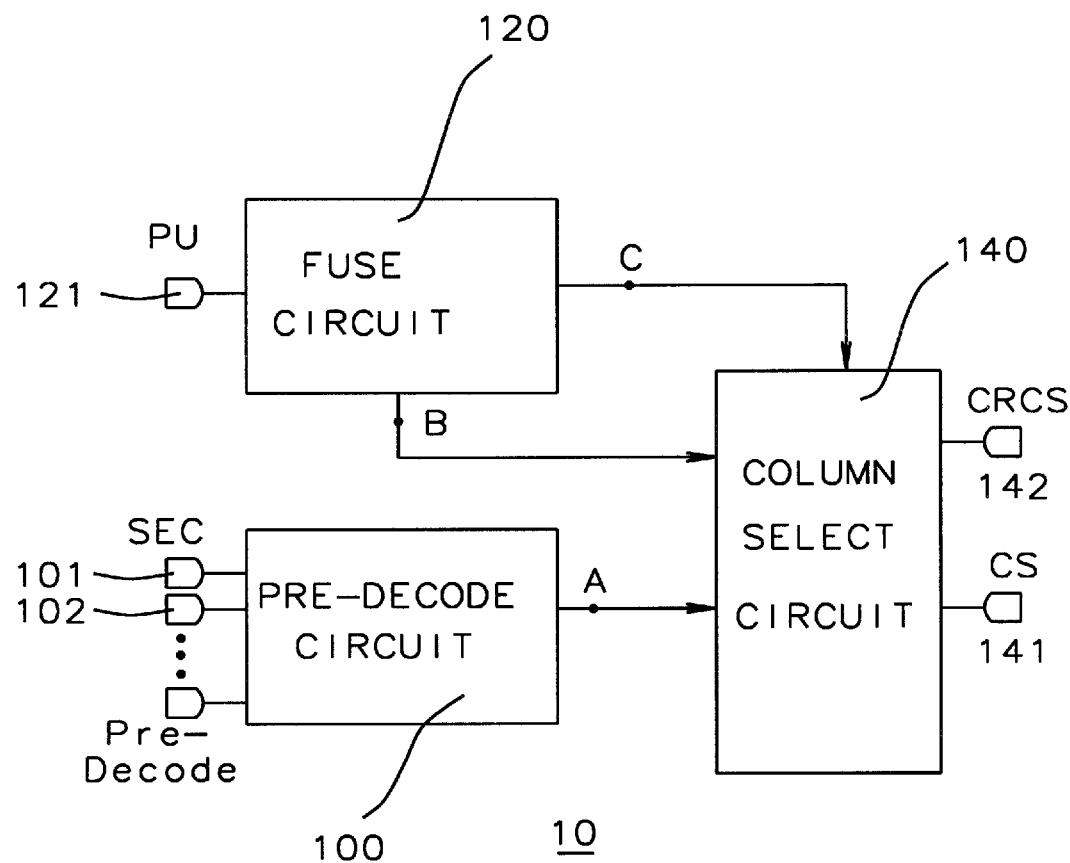
FIG. 1a is a high level block diagram of FIG. 1b of the present invention.

Referring now to FIG. 1a, we show now a high level view of the principle components of the column decoder 10 of the present invention. Pre-decode circuit 100 is connected at terminal A to Column Decode circuit 140. Fuse circuit 120 is connected at terminals B and C to Column Select circuit 140. Signal inputs 101 and 102 connect to inputs of Pre-Decode circuit 100. Signal input 121 connects to an input of Fuse circuit 120. Outputs of Column Select circuit 140 connect to outputs 141 and 142.

Figure 1B:
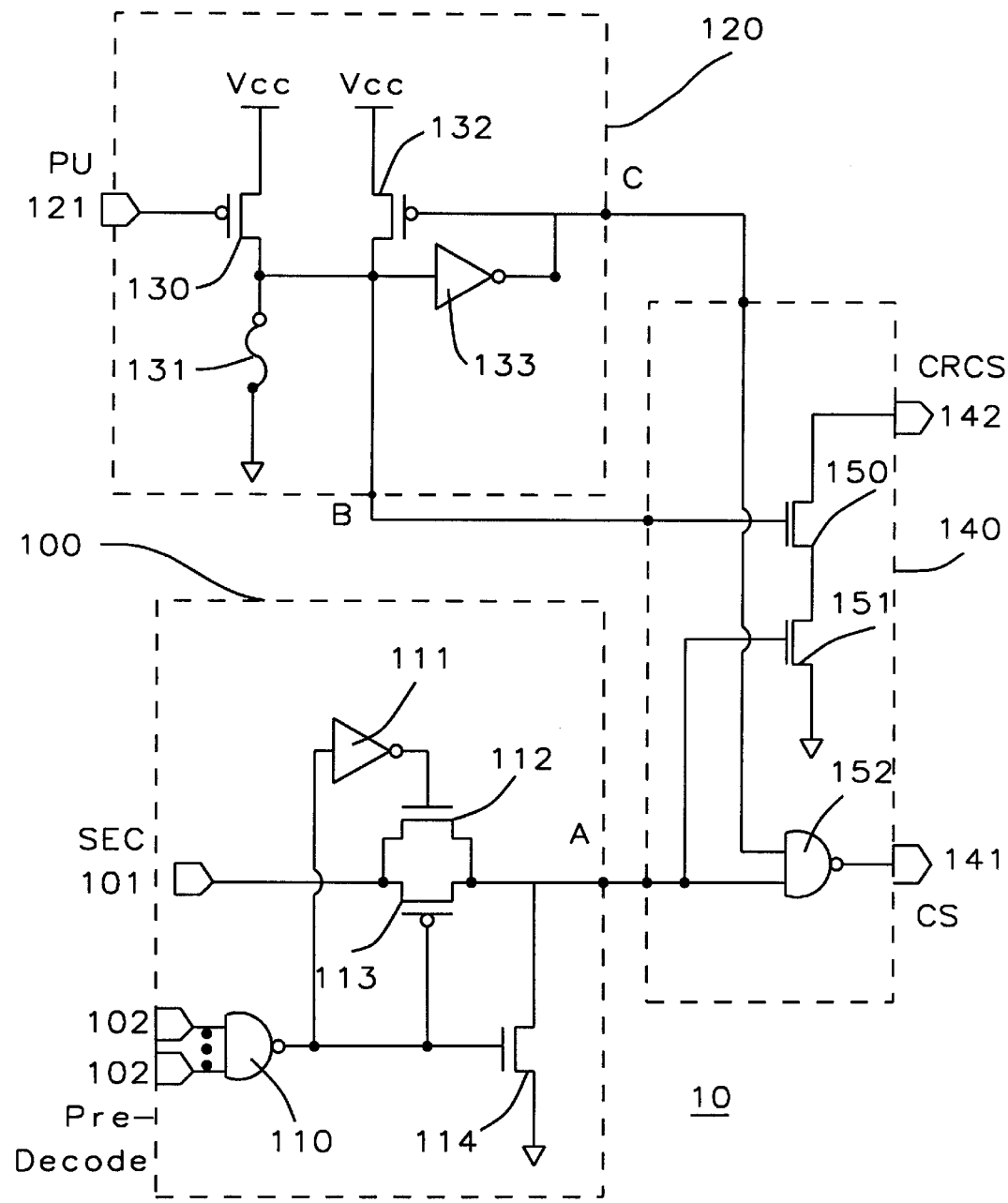
FIG. 1b is a circuit diagram of the column decoder of the present invention.

FIG. 1b shows a column decoder circuit 10 for selecting a redundant array column and deselecting a regular array column if it is faulty. Pre-decode circuit 100 enables terminal A, when a unique array address is decoded. Fuse circuit 120, via terminals B and C, activates the redundant array column selection when fuse 131 is blown. Control signal PU 121 comes from a power-up circuit; PU keeps low at the beginning of power-up to latch nodes B and C, and then rises to $V_{cc}$. Column select circuit 140 with inputs connecting to terminals A, B, and C enables CS output signal 141 or CRCS output signal 142, to select the regular array column or the redundant array column respectively.

A plurality of pre-decode input signals 102 feeds NAND gate 110. Its output connects to inverter 111, to the gate of p-channel transistor 113, and to the gate of n-channel transistor 114. The output of inverter 111 connects to the gate of n-channel transistor 112. The drain of transistor 112 connects to SEC input signal 101, and the drain of transistor 112 connects to output terminal A. P-channel transistor 113 is paralleled with transistor 112. The drain of n-channel transistor 114 is connected to output terminal A and the source of transistor 114 is connected to the reference potential (ground). Pre-decode circuit 100 can also be a NAND type pre-decoder.

PU input signal 121 feeds the gate of p-channel transistor 130. The source of transistor 130 connects to the voltage potential $V_{CC}$ and its drain connects to fuse 131. The other end of fuse 131 connects to ground. P-channel transistor 132 has its source-drain connected between $V_{CC}$ and the drain of p-channel transistor 130. The input of inverter 133 is also connected to the drain of p-channel transistor 130. The output of inverter 133 feeds back to the gate of p-channel transistor 132. Output terminal B connects to the drain of p-channel transistor 130 and terminal C connects to the output of inverter 133.

Output terminal A connects to one input of NAND gate 152 and to the gate of n-channel transistor 151. Output terminal B connects to the gate of n-channel transistor 150. Output terminal C connects to the second input of NAND gate 152. The output of NAND gate 152 connects to CS output 141 of the column select circuit. CRCS output 142 of the column select circuit connects to the drain of n-channel transistor 150, which has its source tied to the drain of n-channel transistor 151. The source of transistor 151 is grounded, thus completing the column select circuit.

When a fault in an array is detected, fuse 131 is blown by a laser cut. During power-up PU is pulled down, causing transistor 130 to conduct and forcing output terminal B to plus. Inverter 133 applies minus to both the gate of transistor 132 and output terminal C. Transistor 150 is, therefore turned on, and NAND gate 152 is degated. CS output 141 is now disabled, and CRCS output 142 has one leg of the AND gate, consisting of transistors 150 and 151, enabled. Transistor 132 latches up the high and low states at terminals B and C respectively, by dumping $V_{CC}$ onto B. This makes deselection permanent even when PU rises to $V_{CC}$ after power-up.

Output terminal A will be at a plus level when both the (section select) SEC input signal 101 and all of the pre-decode input signals 102 are at a plus potential, that is when that specific column is selected. CS output 141 will be enabled (plus) if fuse 131 is not blown, thus selecting a regular array column. If, however, fuse 131 is blown, then CRCS output 142 will be enabled (plus) and the redundant array column will be selected. At the same time CS output 141 will be disabled (plus).

Figure 2:
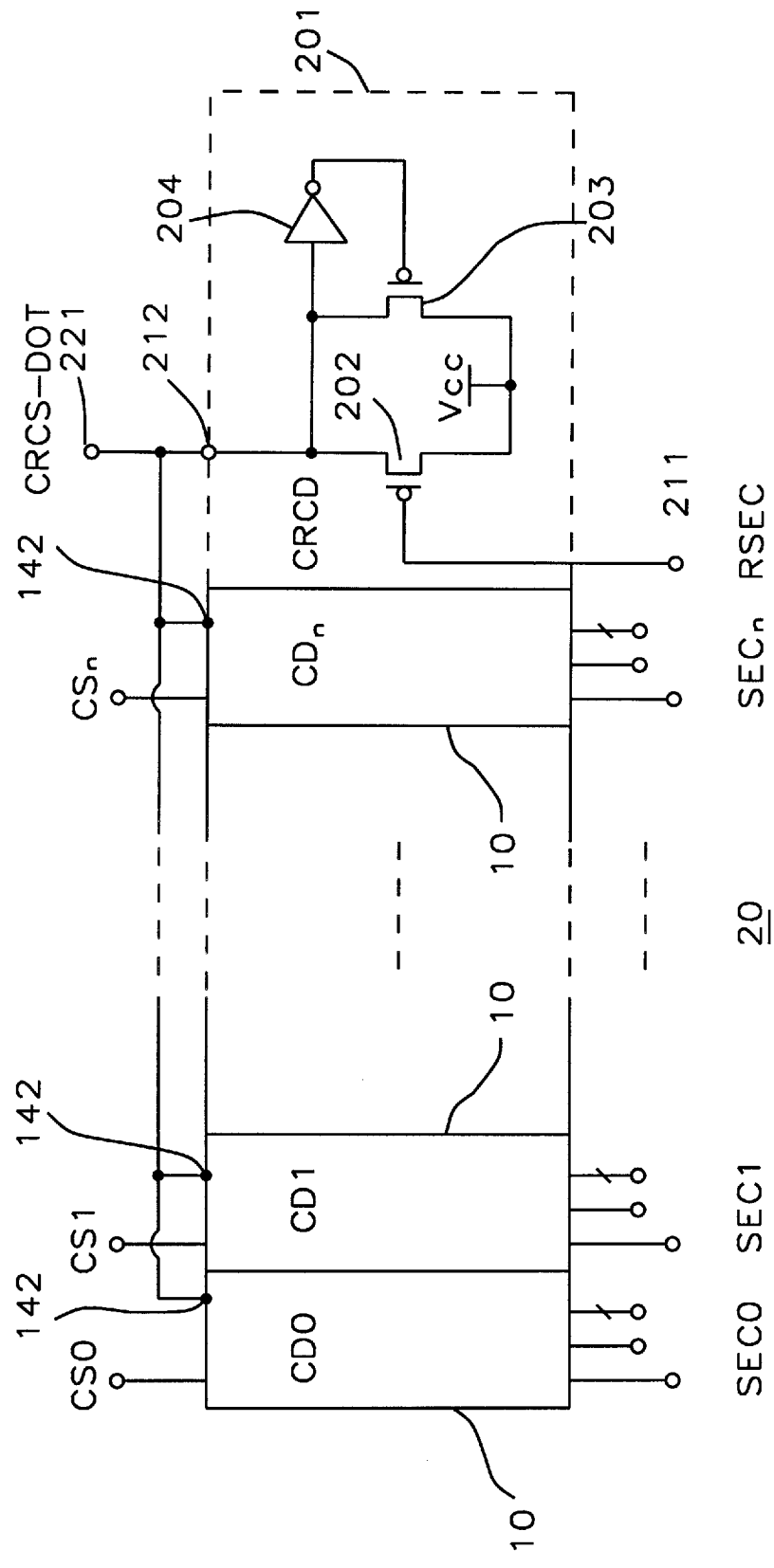
FIG. 2 is a schematic diagram of the column decoder array of the present invention.

Referring now to FIG. 2, we show the column decoder array 20, consisting of a number of column decoder circuits 10 labeled from CD0, CD1 to CDn, and CRCD circuit 201. Input 211, labeled RSEC, is the input for CRCD circuit 201. Circuit 201 consist of p-channel transistor 202, with input RSEC 211 connected to the gate of transistor 202, its source connected to $V_{CC}$, and its drain connected to CRCD output 212. CRCS-DOT output 221, is the DOT-OR of all CRCS outputs 142 and CRCD output 212. CRCD circuit 201 with pull-up transistor 202, small p-channel transistor 203, and inverter 204, disables the redundant array column when RSEC 211 has a negative pulse. If the column address selects the redundancy, node CRCS-DOT 221 will be pulled down to enable the redundant array column.

The function of the DOT-OR is to force CRCS-DOT output 221 to ground whenever any one of the CRCS outputs 142 goes to ground, thus selecting the redundant array. The method of OR'ing all redundant column select lines allows any one of the column decoders, should its associated array fail, to address the redundant array without needing any addressing or other circuitry.

The purpose of disabling the redundant array column has to do with the data line equalization function of the RSEC signal. Whenever the address changes, the address transition detection (ATD) control signal will enable data line equalization. The ATD control signal will force RSEC to minus to set CRCS-DOT high in any cycle and circuit 10 will determine the final state of the CRCS-DOT voltage level, i.e. when selected CRCS-DOT will be pulled down, otherwise CRCS-DOT will stay high, as discussed in the previous paragraph.

Figure 3:
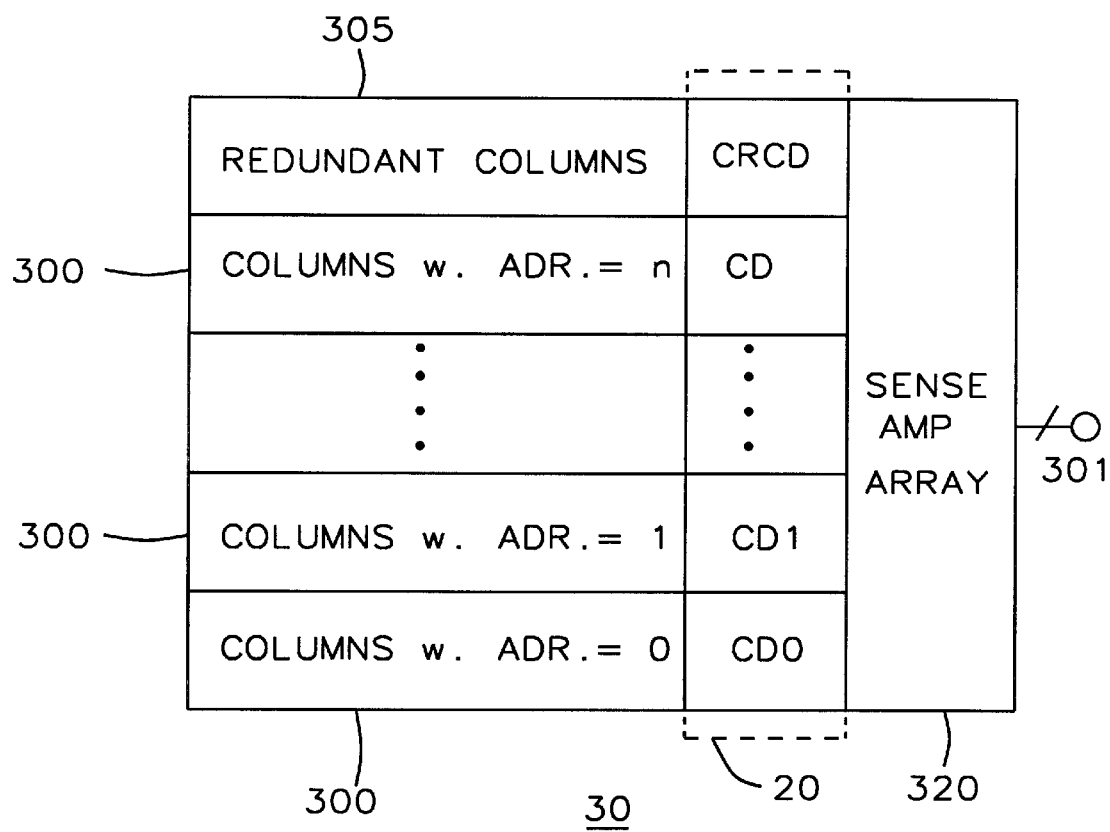
FIG. 3 is a schematic diagram of the array assembly of the present invention.

Referring now to FIG. 3, we show semiconductor memory array assembly 30 as consisting of a plurality of arrays 300 (numbered from address 0 to n) and a redundant array 305, which is in every way identical to arrays 300. Each of these arrays consists of columns of array cells that share the same address. The semiconductor memory array assembly 30 further consists of the column decoder array 20, as depicted in FIG. 2, a sense amplifier array 320, and sense amplifier array output 301.

There is an array corresponding to each column decoder circuit 10, and the redundant array corresponds to CRCD circuit 201 with CRCS-DOT output 221. Column Decoder Array 20 selects which array, including the redundant array, will be read out and amplified by the sense amplifier array.

The sense amplifier array consists of a plurality of sense amplifiers, arranged in columns and rows, each of these sense amplifiers having inputs for receiving the array data and control signal from the column decoder array 20, and an output. The sense amplifier array output consists of a number of output lines equal to the array cells stored in each array. Each of these output lines is the logical "OR" of one of the array cells across all arrays. That is, each cell of the array is OR'ed or DOT-OR'ed across all arrays.

Figure 4:
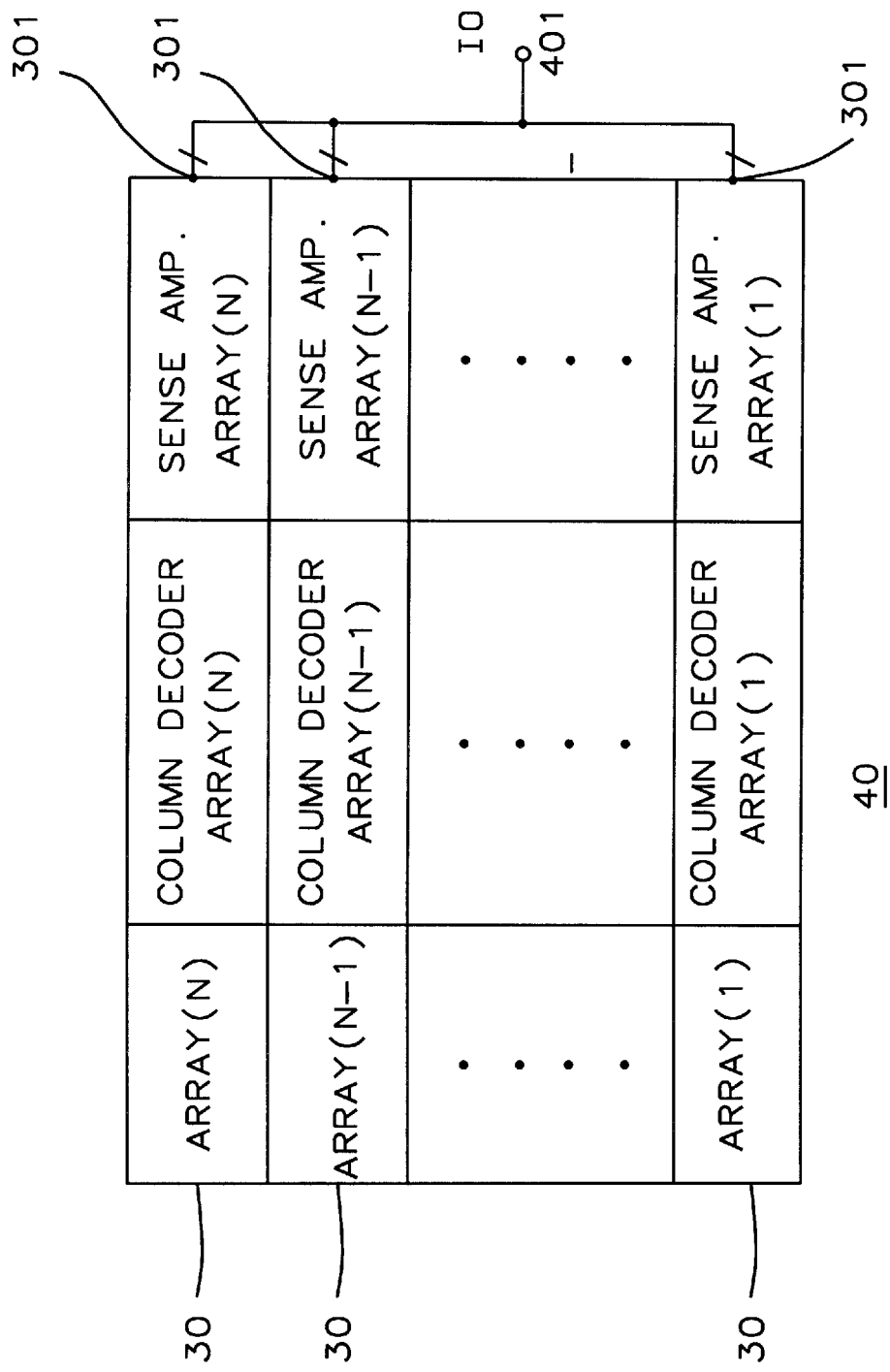
FIG. 4 is a schematic diagram of the semiconductor memory array of the present invention.
Figure 5:
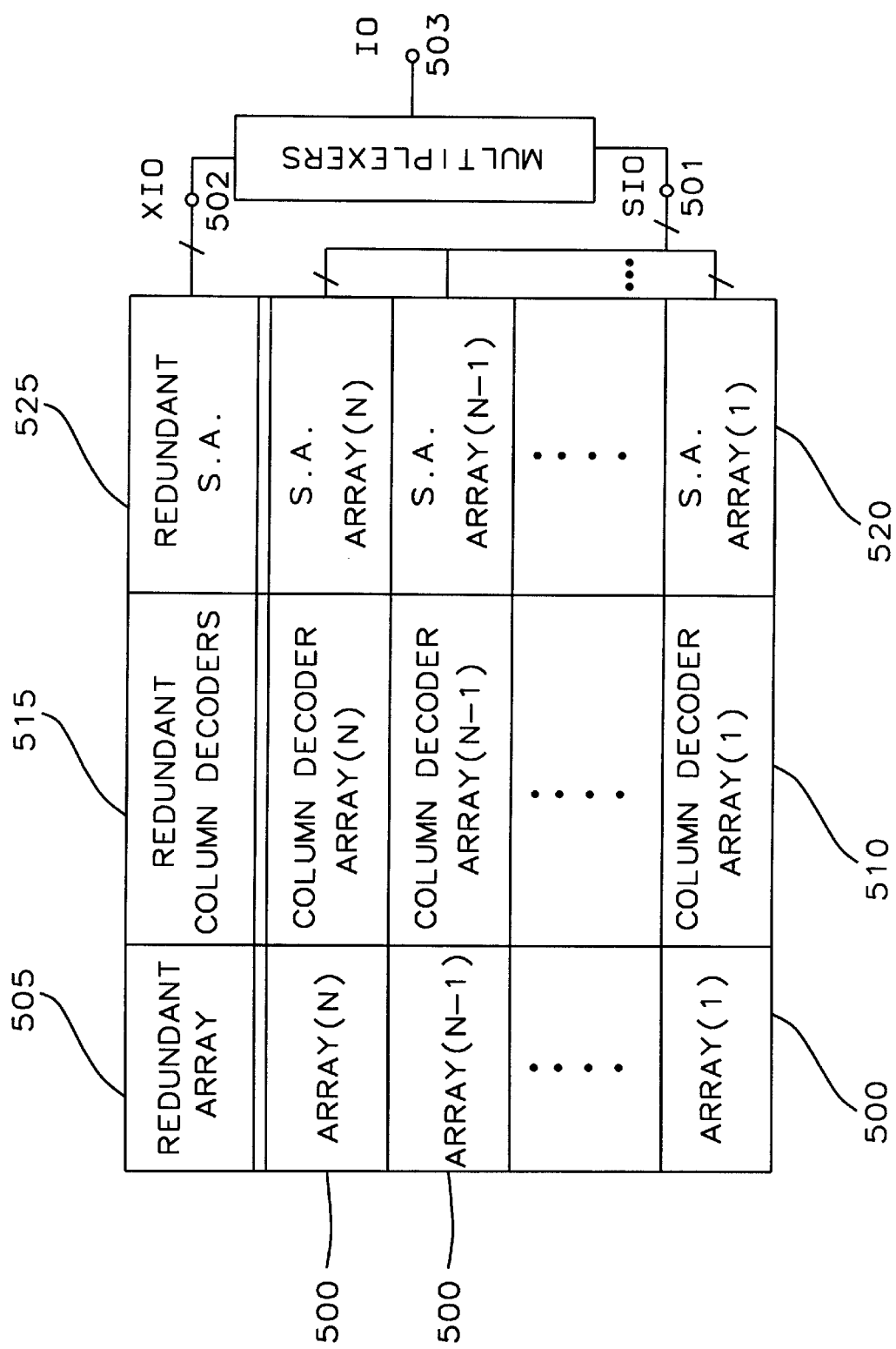
FIG. 5 is a schematic diagram of a semiconductor memory array of the prior art.

Referring now to FIG. 4, we show semiconductor memory 40 consisting of a number of identical array assemblies 30, shown in FIG. 3, where the array assemblies are numbered from 1 to N. Semiconductor memory output 401 delivers the memory data to the host. The lines which make up the output of the semiconductor memory are equal in number to the array cells as stored in the columns which make up the arrays 300 or 305, as the case may be. Each line of the semiconductor memory output 401 is the logical "OR" of one line of the sense amplifier array output 301, across all array assemblies.

Figure 6:
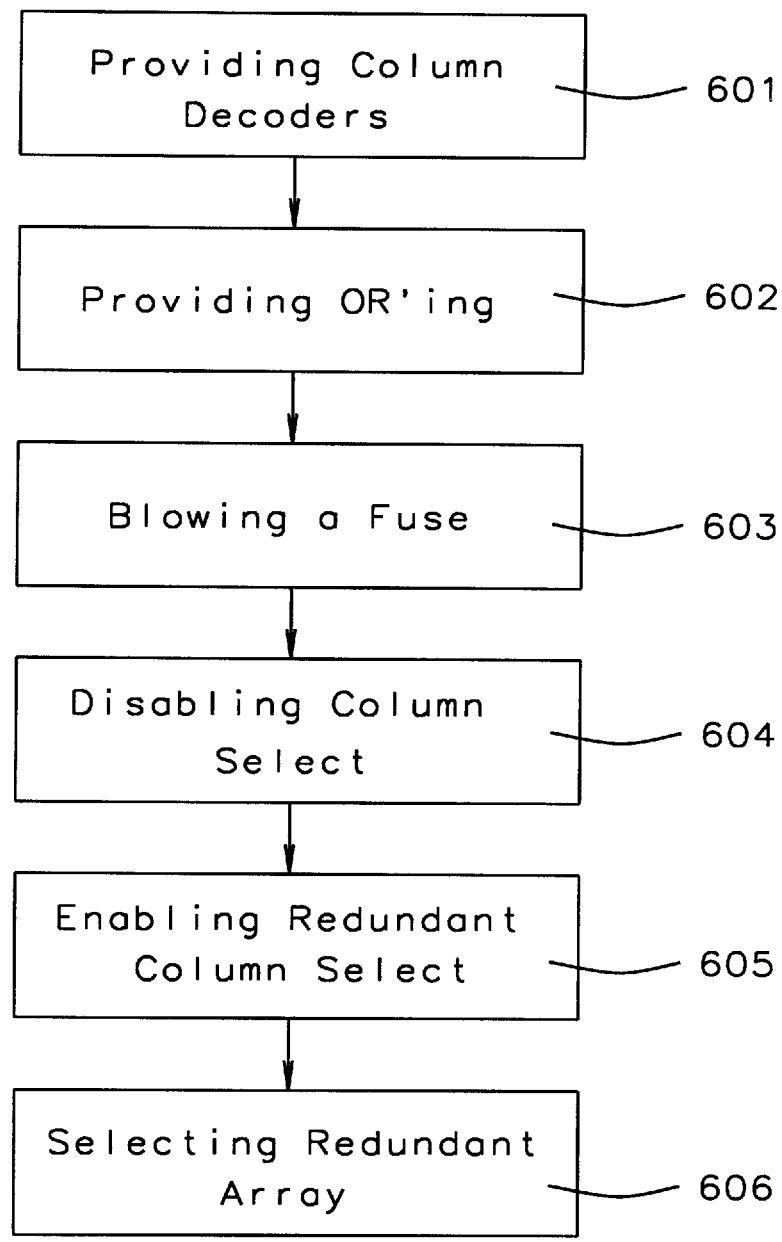
FIG. 6 is a block diagram illustrating the method of the present invention.

Referring now to FIG. 6, we show a block diagram of the method of the present invention. Block 601 provides column decoders. Each column decoder is associated with an array, and each column decoder provides a column select line to select data from its array. Each column decoder also provides a redundant column select line for selecting data from the redundant array. Block 602 is providing OR'ing of all redundant column select lines. When a faulty array is detected, the fuse is blown (Block 603) by a laser cut in the circuit of the column decoder and an input line PU, associated with the column decoder of the faulty array, is pulled down at the beginning of power-up to make deselection permanent. Block 604 shows disabling of the column select line associated with the faulty array. Concurrently, in Block 605, enabling of the redundant column select line occurs, by pulling it down to logical zero. By providing the method of OR'ing, as per Block 602, the redundant column select line of each column select circuit is pulled down, thus selecting the redundant array with different I/O, Block 606. The method of OR'ing the redundant column select line of each column select circuit allows any one of the column decoders, should its associated array fail, to address the redundant array without needing any addressing or other circuitry.

Advantages of the described circuits and method of this invention are a) a novel column decoder, b) neighboring cells in an array are arranged to be of the same column address, i.e. all cells of the same address are read out at the same time, and c) blowing of the fuse in the column decoder will disable the regular, but defective, column and enable the redundant column. The circuits and methods described above are equally applicable to a static random access memory (SRAM) or a dynamic random access memory (DRAM).

The customary disadvantages of prior art have thus been avoided: a) use of extra column decoders, b) need for additional sense amplifiers, c) need for redundant IO signals (XIO), and d) use of complicated XIO/IO multiplexers. The structures are all difficult to implement, consume chip real estate area, and cause extra delays.

While the invention has been particularly shown and described with reference to the preferred embodiments thereof, it will be understood by those skilled in the art that various changes in form and details may be made without departing from the spirit and scope of the invention.

What is claimed is:

1. A semiconductor memory with a column decoder circuit for selecting a redundant array column, said column decoder circuit comprising:
    a pre-decode circuit with a first input, comprising a plurality of address lines, a second input, and a terminal A, said pre-decode circuit decoding a unique array address;
    a fuse circuit with a third input, a terminal B, and a terminal C, said fuse circuit activating a redundant column select function;
    a column select circuit with a fourth input connected to said terminal A, a fifth input connected to said terminal B, a sixth input connected to said terminal C, a first output CS, and a second output CRCS, said column select circuit enabling or disabling the selection of an array column;
    a voltage potential; and
    a reference potential.

2. The semiconductor memory of claim 1, wherein said pre-decode circuit comprises:
    a first NAND gate, with a plurality of inputs and an output, said plurality of inputs of said first NAND gate connected to said plurality of address lines;
    a first inverter with an input and an output, said input of said first inverter connected to the output of said first NAND gate;
    a first n-channel transistor having a drain-source path and a gate, said drain-source of said first n-channel transistor connected between said second input and said first terminal A, and said gate of said first n-channel transistor connected to said output of said first inverter;
    a first p-channel transistor having a source-drain path and a gate, said source-drain of said first p-channel transistor connected between said second input and said first terminal A, and said gate of said first p-channel transistor connected to said output of said first NAND gate; and
    a second n-channel transistor having a drain-source path and a gate, said drain-source of said second n-channel transistor connected between said first terminal A and said reference potential.

3. The semiconductor memory of claim 1, wherein said fuse circuit comprises:
    a second p-channel transistor having a source-drain path and a gate, said source of said second p-channel transistor connected to said voltage potential and said gate of said second p-channel transistor connected to said third input;
    a fuse connected between said drain of said second p-channel transistor and said reference potential;
    a third p-channel transistor having a source-drain path and a gate, said source-drain of said third p-channel transistor connected between said voltage potential and said drain of said second p-channel transistor;
    a second inverter with an input and an output, said input of said second inverter connected to the drain of said second p-channel transistor, said output of said second inverter connected to said gate of said third p-channel transistor;
    said terminal B connected to said drain of said second p-channel transistor; and
    said terminal C connected to said output of said second inverter.

4. The semiconductor memory of claim 1, wherein said column select circuit comprises:
    a third n-channel transistor having a drain-source path and a gate, said drain of said third n-channel transistor connected to said second output and said gate of said third n-channel transistor connected to said fifth input;
    a fourth n-channel transistor having a drain-source path and a gate, said drain-source of said fourth n-channel transistor connected between said source of said third n-channel transistor and said reference potential, said gate of said fourth n-channel transistor connected to said fourth input; and
    a second NAND gate with two inputs and an output, said first input of said second NAND gate connected to said fourth input, and said second input of said second NAND gate connected to said sixth input, the output of said second NAND gate connected to said first output.

5. The pre-decode circuit of claim 2, wherein a voltage signal at said terminal A will be at a voltage close to said voltage potential, when a voltage signal, applied to said first input, is close to said voltage potential, provided that a voltage signal, applied to said second input, is close to said reference potential.

6. The fuse circuit of claim 3, wherein said fuse will blow by a laser cut.

7. The fuse circuit of claim 3, wherein a voltage signal at said terminal B will be latched up at a voltage close to said voltage potential, when said third input is close to said reference potential.

8. The fuse circuit of claim 3, wherein a voltage signal at said terminal C will be latched up at a voltage close to said reference potential, when said third input is close to said voltage potential.

9. The column select circuit of claim 4, wherein a voltage signal at said first output will be at a voltage close to said reference potential, when a voltage signal, applied to said sixth input, is close to said voltage potential, provided that a voltage signal at said fourth input is close to said voltage potential.

10. The column select circuit of claim 4, wherein a voltage signal at said second output will be at a voltage close to said reference potential, when a voltage signal, applied to said fifth input, is close to said voltage potential, provided that a voltage signal at said fourth input is close to said voltage potential.

11. The semiconductor memory of claim 1, with a column decoder array, further comprising:
    a redundant column decoder circuit, with a seventh input and a third output, said seventh input being a redundant section select input, said redundant column decoder circuit providing data line equalization for a redundant array; and
    a plurality of said column decoder circuits, said second output of all of said column decoder circuits connected to said third output of said redundant column decoder circuit.

12. The semiconductor memory of claim 11, wherein said redundant column decoder circuit comprises:

a fourth p-channel transistor having a source-drain path and a gate, said source-drain of said fourth p-channel transistor connected between said voltage potential and said third output, said gate of said fourth p-channel transistor connected to said seventh input;

a fifth p-channel transistor having a source-drain path and a gate, said source-drain of said fifth p-channel transistor connected between said voltage potential and said third output; and a third inverter with an input and an output, said input of said third inverter connected to said third output, and said output of said third inverter connected to said gate of said fifth p-channel transistor.

13. The semiconductor memory of claim 11, wherein a voltage signal applied to said seventh input will be pulsed to swing from a potential close to said reference potential to a voltage close to said voltage potential and back to a voltage close to said reference potential.

14. The semiconductor memory of claim 11, wherein said third output will drop to a voltage level close to said reference potential when any one of said plurality of second outputs switches to a voltage level close to said reference voltage.

15. The semiconductor memory of claim 11, with an array assembly, further comprising:

a plurality of arrays, each with a number of array cells, said plurality of arrays corresponding one-to-one to said plurality of column decoder circuits;

a redundant array, with a number of array cells, said redundant array corresponding to said redundant column decoder circuit;

a sense amplifier array with a plurality of sense amplifiers, each of said sense amplifiers having inputs and an output; and a sense amplifier array output with a plurality of lines equal to said number of array cells in one of said arrays.

16. The semiconductor memory of claim 15, wherein said array cells in one of said arrays share a common array address.

17. The semiconductor memory of claim 15, wherein each line of said sense amplifier array output is the logical "OR" of one of said array cells across said arrays.

18. The semiconductor memory of claim 15, further comprising:

a plurality of said array assemblies; and a semiconductor memory output with a plurality of lines for displaying array data.

19. The semiconductor memory of claim 18, wherein said plurality of lines of said semiconductor memory output is equal to said number of array cells.

20. The semiconductor memory of claim 18, wherein each line of said semiconductor memory output is the logical "OR" of one line of said sense amplifier array output across said plurality of array assemblies.

21. The semiconductor memory of claim 18, wherein said semiconductor memory may be a static random access memory.

22. The semiconductor memory of claim 18, wherein said semiconductor memory may be a dynamic random access memory.

* * * * *